(12) United States Patent
Lu et al.

(10) Patent No.: US 12,021,478 B1
(45) Date of Patent: Jun. 25, 2024

(54) HYBRID SYSTEM FOR ELECTRICITY AND WATER GENERATION, PASSIVE COOLING INDUCED CO-GENERATOR APPARATUS, AND MANUFACTURING METHOD THEREFOR

(71) Applicant: City University of Hong Kong, Kowloon (HK)

(72) Inventors: Jian Lu, Kowloon (HK); Zhengyi Mao, Kowloon (HK); Qiliang Wang, Kowloon (HK); Yao Yao, Kowloon (HK); Zhaowenbo Cao, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 18/334,480

(22) Filed: Jun. 14, 2023

(51) Int. Cl.
*H02S 10/30* (2014.01)

(52) U.S. Cl.
CPC .................. *H02S 10/30* (2014.12)

(58) Field of Classification Search
CPC ........................................... H02S 10/30
See application file for complete search history.

(56) References Cited

U.S. PATENT DOCUMENTS 6,026,890 A * 2/2000 Akachi ............... F28D 15/0275
165/177

OTHER PUBLICATIONS

Date et al., "Performance review of a novel combined thermoelectric power generation and water desalination system", Renewable Energy 83 (2015) 256-269. (Year: 2015).*
Zhu et al., "Shape Conformal and Thermal Insulative Organic Solar Absorber Sponge for Photothermal Water Evaporation and Thermoelectric Power Generation", Adv. Energy Mater. 2019, 9, 1900250. (Year: 2019).*
Li et al., "Harvesting conductive heat loss of interfacial solar evaporator for thermoelectric power generation", Applied Thermal Engineering 208 (2022) 118279. (Year: 2022).*
Adv. Energy Mater. 2019, 9, 1900250; DOI: 10.1002/aenm. 201900250; Shape Conformal and Thermal Insulative Organic Solar Absorber Sponge for Photothermal Water Evaporation and Thermoelectric Power Generation; L. Zhu et al.
Li et al., Storage and Recycling of Interfacial Solar Steam Enthalpy, Joule 2, 1-8 (2018), https://doi.org/10.1016/j.joule.2018.08.008.

* cited by examiner

*Primary Examiner* — Tae-Sik Kang
(74) *Attorney, Agent, or Firm* — Renner, Kenner, Greive, Bobak, Taylor & Weber

(57) ABSTRACT

There is provided a hybrid system for electricity and water generation, that includes a thermoelectric generator (TEG) layer for converting heat to electricity, an absorber layer arranged on one side of the TEG layer for converting solar energy to heat, a cooling structure arranged on the other side of the TEG layer for dissipating a waste heat from the TEG layer, and an evaporator configured to form an interfacial cooling region with the cooling structure for water generation.

21 Claims, 11 Drawing Sheets

HYBRID SYSTEM FOR ELECTRICITY AND WATER GENERATION, PASSIVE COOLING INDUCED CO-GENERATOR APPARATUS, AND MANUFACTURING METHOD THEREFOR

TECHNICAL FIELD

The present invention relates to devices and methods for electricity and water co-generation. In particular, the present invention provides a hybrid system for electricity and water generation, a passive cooling induced co-generator apparatus including the hybrid system and a manufacturing method for the hybrid system.

BACKGROUND

Freshwater and energy are two intertwined fundamental elements for human civilization and sustainable development. Solar energy, being the most inexhaustible and environmentally friendly energy source, has attracted tremendous attention to provide a highly promising way for producing green electricity and clean water.

Benefiting from intensive research efforts in recent years, a range of water and energy co-generators have been developed to provide renewable and decentralized clean water and electricity and can be divided into two kinds of strategies: i) using evaporation induced water/ions flow to generate electricity. During water evaporation, the voltage can be extracted from the salinity gradient or the interaction between water molecule and functional groups on generator materials such as carbon materials. However, electricity generation performances vary significantly in different liquids, which show insufficient universality in practical water purification applications, such as removal of heavy metal ions and organic contaminants. And it also suffers from limited material selection. ii) Using the heat of water evaporation for electricity generation. By storage and recycling steam enthalpy, a group of researchers achieved a thermo-electricity power of 292.9 W/m2 under the 30 kW/m2 sun irrigation ["Storage and recycling of interfacial solar steam enthalpy", Joule 2.11 (2018): 2477-2484, Xiuqiang Li, et al.]. Another group of researchers have developed a hybrid device, an interfacial solar water evaporator is attached above the surface of thermoelectric generator (TEG), to simultaneously produce clean water and electricity ["Shape conformal and thermal insulative organic solar absorber sponge for photothermal water evaporation and thermoelectric power generation", Advanced Energy Materials 9.22 (2019): 1900250, Liangliang Zhu, et al.]. However, the salt-fouling issue and long-term process of the hybrid systems should be considered. During continuous desalination, the precipitated salt not only compromises the sunlight absorption and reduces the evaporation rate, but also has a negative effect on the lifespan of solar evaporators. Besides, with the long-term operation, the warming bulk water results in decreasing the different temperatures in both sides of the TEG module, leading to electricity generation performance deterioration dramatically and ultimately stopping the system. Moreover, most, if not all, of previous cogenerators typically use a transparent cover above a solar evaporator for vapor condensation, which leads to a high optical loss (up to 35%) and inefficient condensation. Consequentially, the over-all efficiency of solar to collected water and generated electricity are significantly reduced. Therefore, advanced structures and heat management strategy that can facilitate high efficiency electricity-water generation while simultaneously maintaining long-term stability and wide adaptability for practical application are the key for next generation solar electricity-water cogenerator design.

SUMMARY OF THE INVENTION

According to an aspect of the present invention, there is provided a hybrid system for electricity and water generation. The hybrid system includes a thermoelectric generator (TEG) layer for converting heat to electricity, an absorber layer arranged on one side of the TEG layer for converting solar energy to heat, a cooling structure arranged on the other side of the TEG layer for dissipating a waste heat from the TEG layer, and an evaporator configured to form an interfacial cooling region with the cooling structure for water generation.

In some embodiments, the cooling structure may be arranged on a lower surface of the TEG layer.

In some embodiments, the cooling structure may include two or more plates extending toward the evaporator to provide the interfacial cooling region.

In some embodiments, the two or more plates may include metal plates.

In some embodiments, the cooling structure may include Cu, Al, Ag, Ni, stainless steel or a mixture thereof.

In some embodiments, each of the two or more metal plates may have a thickness of about 50 μm-1500 μm.

In some embodiments, the evaporator may include a base part, and a contact part on the base part, configured to receive the two or more plates.

In some embodiments, the contact part may include two or more columns that correspond to the two or more metal plates, and the two or more metal plates may be configured to be inserted into the two or more columns respectively.

In some embodiments, the evaporator may include a porous polymer.

In some embodiments, the porous polymer may have a porosity of about 50%-90%.

In some embodiments, the absorber layer may include a photo-thermal material to convert the solar energy to heat, and a polymer matrix to attach the photo-thermal material on the TEG layer.

In some embodiments, the photo-thermal material may include a carbon nanotube, carbon black, carbon nanodots, graphene, MXenes, PPy or a mixture thereof.

In some embodiments, the polymer matrix may include polyurethane, cellulose, alginate, polyvinyl alcohol, polyacrylamide, PDMS or a mixture thereof.

In some embodiments, the absorber layer may be arranged on an upper surface of the TEG layer.

According to another aspect of the present invention, there is provided an invert-structured passive cooling induced co-generator (PICG) apparatus. The invert-structured PICG apparatus includes a PICG module including the aforementioned hybrid system, a water supply channel to supply non-purified water to the hybrid system, a cooling box configured to surround the PICG module and to condense vapor generated from the hybrid system of the PICG module, a water collection part to collect the condensed vapor from the cooling box, and a closed chamber to float the apparatus on a surface of the non-purified water.

In some embodiments, the generated vapor may be condensed on the sidewall of the cooling box.

In some embodiments, the absorber layer of the hybrid system may be exposed above a top surface of the cooling box.

According to yet another aspect of the present invention, there is provided a method for manufacturing a hybrid system for electricity and water generation. The method includes preparing an evaporator, preparing a thermoelectric generator (TEG) layer, coating an absorber layer on one side of the TEG layer, attaching a cooling structure on the other side of the TEG layer, and assembling the TEG layer with the absorber layer and the cooling structure, with the evaporator, such that the cooling structure contacts the evaporator to form an interfacial cooling region.

In some embodiments, preparing the evaporator may include a directional freezing process and a freeze-drying process.

In some embodiments, the directional freezing process may be performed in a directional freezing speed of 0.5° C./min, 1° C./min, 2° C./min, 3° C./min, 4° C./min, 5° C./min, 6° C./min, 7° C./min, 8° C./min, 9° C./min, 10° C./min, or any point value within a range consisting of a pairwise combination of those point values.

In some embodiments, the absorber layer may include a photo-thermal material and a polymer matrix, and coating the absorber layer on one side of the TEG layer may include using the polymeric matrix for adhesion of the absorber layer on the TEG layer.

In some embodiments, coating the absorber layer on one side of the TEG layer may further include curing the polymer matrix under 50° C., 60° C., 70° C., 80° C., 90° C., 100° C., 110° C., 120° C., 130° C., 140° C., 150° C., or any point value within a range consisting of a pairwise combination of those point values.

In some embodiments, the cooling structure may include two or more plates and the evaporator may include a contact part having two or more columns that correspond to the two or more metal plates respectively, and assembling the TEG layer with the absorber layer and the cooling structure with the evaporator may include inserting the two or more metal plates into the two or more columns respectively to provide the interfacial cooling region.

Other features and aspects of the invention will become apparent by consideration of the following detailed description, drawings and claims.

Before any independent constructions of the invention are explained in detail, it is to be understood that the invention is not limited in its application to the details of construction and the arrangement of components set forth in the following description or illustrated in the following drawings. The invention is capable of other independent constructions and of being practiced or of being carried out in various ways. Also, it is to be understood that the phraseology and terminology used herein is for the purpose of description and should not be regarded as limiting.

Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof.

BRIEF DESCRIPTION OF DRAWINGS

These and other features of the invention will become more apparent from the following description, by way of example only, with reference to the accompanying drawings, in which.

DETAILED DESCRIPTION OF PREFERRED EMBODIMENTS

Based on the inadequacies of prior art, the present disclosure provides a hybrid system with passive interfacial cooling (PIC) effect for high efficient solar electricity-water generation. Different from the water flow or heat flow induced power conversion as discussed regarding the prior art, this PIC strategy exhibits integrative utilization of multistage energy, including waste heat from a cold side of a thermoelectric generator (TEG), latent heat with phase change, and energy from environment, which contributes to high efficient electricity-water generation.

Hereinafter, certain exemplary embodiments will now be described to provide an overall understanding of the preparation, mechanism, function, and use of the devices and methods disclosed herein. One or more examples of these embodiments are illustrated with reference to the accompanying drawings. Those skilled in the art will understand that the devices and methods specifically described herein and illustrated in the accompanying drawings are non-limiting exemplary embodiments and that the scope of the present disclosure is defined solely by the claims. The features illustrated or described in connection with one exemplary embodiment may be combined with the features of other embodiments. Such modifications and variations are intended to be included within the scope of the present disclosure. Further, in the present disclosure, like-numbered components of various embodiments generally have similar features when those components are of a similar nature and/or serve a similar purpose.

According to an embodiment, there is provided a hybrid system using a passive interfacial cooling effect which brings high efficient electricity and water generation.

Figure 1:
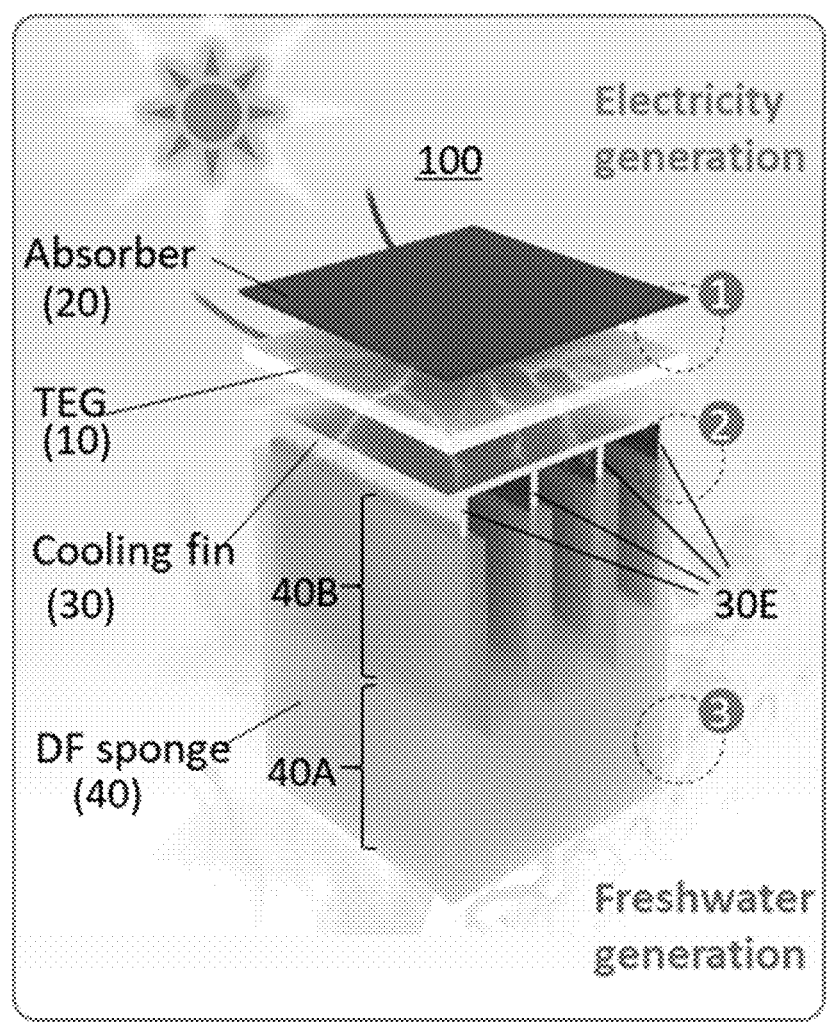
FIG. 1 is a schematic diagram of a hybrid system according to an embodiment of the present invention.

With reference to FIG. 1, a hybrid system 100 for electricity and water generation includes a thermoelectric generator (TEG) layer 10 for converting heat to electricity, an absorber layer 20 arranged on one side of the TEG layer 10 for converting solar energy to heat, a cooling structure 30 arranged on the other side of the TEG layer 10 for dissipating a waste heat from the TEG layer 10, and an evaporator 40 configured to form an interfacial cooling region with the cooling structure 30 for water generation.

The TEG layer 10 is provided for electricity generation. The TEG layer 10 may be any known TEG layer or a commercial TEG layer.

The absorber layer 20 may be arranged on an upper surface of the TEG layer 10. The upper surface of the TEG layer 10 can be, so called, a hot side of the TEG layer 10. The absorber layer 20 converts solar energy to heat as a main energy input for the hybrid system 100. For example, the TEG layer 10 can be covered by the absorber layer 20, i.e., a polymeric thin film for prominent light-heat conversion. The absorber layer 20 may include a photo-thermal material to convert the solar energy to heat and a polymer matrix to attach the photo-thermal material on the TEG layer 10. The polymer matrix is provided for adhesion of the photo-thermal material on the TEG layer 10 as well as forming a protect layer. The polymeric thin film may include the photo-thermal material.

The photo-thermal material includes, but is not limited to, a carbon nanotube, carbon black, carbon nanodots, graphene, MXenes, polypyrrole (PPy) or a mixture thereof. The photo-thermal material in the absorber layer 20 has a mass percentage of 1%-20%. For example, the photo-thermal material in the absorber layer 20 may have a mass percentage of 1%, 3%, 5%, 15%, 20%, or any point value within a range consisting of a pairwise combination of those point values, provided that the sum of the mass percentages of the components in the absorber layer 20 is 100%.

The polymer matrix in the absorber layer 20 may have a polymer which includes, but is not limited to, polyurethane, cellulose, alginate, polyvinyl alcohol, polyacrylamide, Polydimethylsiloxane (PDMS) or a mixture thereof.

In an embodiment, the absorber layer 20 has a thickness of about 50 µm-1000 µm. For example, the absorber layer 20 may have a thickness of 50 µm, 100 µm, 200 µm, 300 µm, 400 µm, 500 µm, 600 µm, 700 µm, 800 µm, 900 µm, or 1000 µm.

The cooling structure 30 is provided for dissipating a waste heat from the TEG layer 10 to the evaporator 40 for fresh water generation. The cooling structure 30 is arranged on a lower surface of the TEG layer 10. That is, the cooling structure 30 can be attached to, so called, a cold side of the TEG layer 10 for fast heat conduction. As shown in FIG. 1, the cooling structure 30 includes a base plate having a surface which is attached to the cold side of the TEG layer 10 and two or more plates 30E extending toward the evaporator 40 to provide the interfacial cooling region. The cooling structure 30 having the base plate and the two or more plates 30E can be called as a cooling fin. Four plates 30E are illustrated in FIG. 1. The plates 30E of the cooling structure 30 may be metal plates. For example, the cooling structure 30 may include Cu, Al, Ag, Ni, stainless steel or a mixture thereof. In an embodiment, each of the metal plates 30E has a thickness of about 50 µm-1500 µm. For example, each of the metal plates 30E may have a thickness of 50 µm, 100 µm, 200 µm, 300 µm, 400 µm, 500 µm, 600 µm, 700 µm, 800 µm, 900 µm, 1000 µm, or 2000 µm.

The evaporator is provided for vapor generation and further heat dissipating by water evaporation. Energy from the surrounding is also absorbed for evaporation. The evaporator 40 may include a sponge prepared by directional freezing (DF sponge). The evaporator 40 may include a base part 40A and a contact part 40B to provide the interfacial cooling region with the cooling structure 30. The contact part 40B may include two or more columns that correspond to the two or more metal plates 30E of the cooling structure 30. As shown in FIG. 1, the contact part 40B including the two or more columns may be "trident" shaped. This shape can be prepared, for example, by directional freezing. The cooling structure 30 is inserted into the evaporator 40 to form the interfacial regions. In particular, the two or more metal plates 30E of the cooling structure 30 are configured to be inserted into the two or more columns of the contact part 40B, respectively. These designs can strengthen the passive interfacial evaporation cooling and freshwater production.

In an embodiment, the evaporator 40 may include a porous polymer. For example, the porous polymer may have a porosity of 50%-90%. For example, the porous polymer may have a porosity of 50%, 60%, 70%, 80%, 90%, or any point value within a range consisting of a pairwise combination of those point values.

In an embodiment, the polymer may include polyurethane, cellulose, alginate, polyvinyl alcohol, polyacrylamide, polyethylene glycol diacrylate (PEGDA), or a mixture thereof.

In an embodiment, the polymer in the evaporator 40 may have a mass percentage of 5%-50%. For example, the polymer in the evaporator 40 may have a mass percentage of 5%, 10%, 20%, 30%, 40%, 50%, or any point value within a range consisting of a pairwise combination of those point values.

Figure 2:
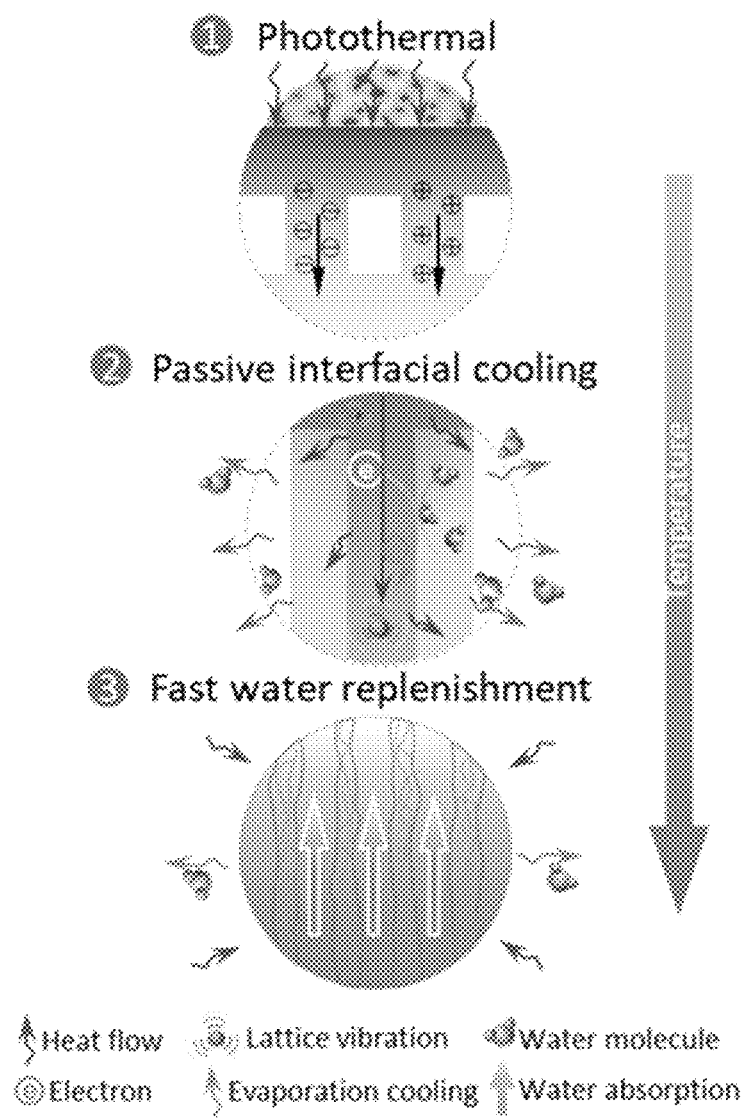
FIG. 2 illustrates heat flow of the hybrid system during operation according to an embodiment of the present invention.

FIG. 2 illustrates heat flow of the hybrid system as shown in FIG. 1 during operation according to an embodiment of the present invention. With reference to FIG. 2, heat flow during the operation can be divided into three steps. (i) The absorber layer 20 converts sunlight (i.e., solar energy) to heat as a main energy input and the heat flows through the TEG layer 10 for electricity generation. (ii) The heat is conducted to the evaporator 40 via the cooling structure 30. Due to the engineering design of the cooling structure 30 and evaporator 40, the heat at the interfacial regions could be efficiently dissipated by interfacial water evaporation, leading to an enhanced passive cooling effect and water generation. The passive interfacial cooling (PIC) effect further decreases the temperature of the cold side of the TEG layer 10, which achieves an improved electricity generation. (iii) Heat input from environments. The bottom part of the evaporator 40 where the temperature is lower than that of room temperature can further absorb environmental energy for freshwater generation.

Figure 3:
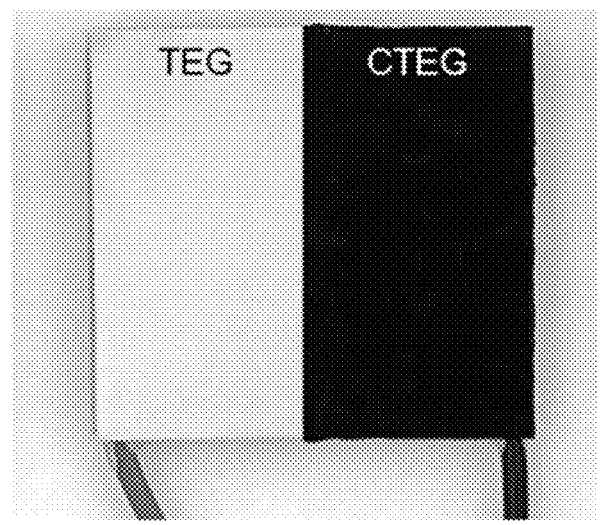
FIG. 3 shows optical images of a thermoelectric generator (TEG) before and after coating of an absorber layer, according to an embodiment of the invention.

FIG. 3 shows optical images of the TEG layer 10 before coating it with the absorber layer 20 ("TEG" in the left side) and after coating it with the absorber layer 20 (coated TEG, CTEG, in the right side). As shown in FIG. 3, after coating the TEG layer 10 with the absorber layer 20, the color of the TEG layer 10 turns from white to black to facilitate light absorption.

Figure 4:
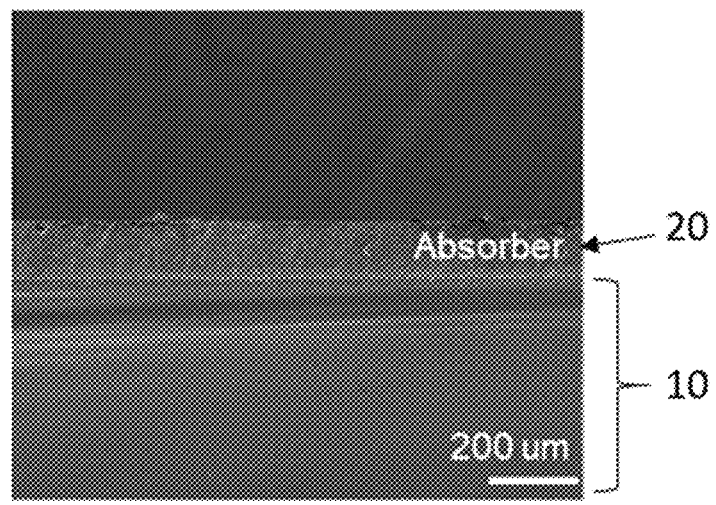
FIG. 4 shows a SEM image of an interface between an absorber layer and a TEG layer according to an embodiment of the present invention.

FIG. 4 shows a SEM image of an interface between the absorber layer 20 and the TEG layer 10. As shown in FIG. 4, the absorber layer 20 with a thickness of around 100 μm is closely bonded on the TEG layer 10. No gaps are observed at the interface and it demonstrates tight adhesion of the absorber layer 20 onto the TEG layer 10.

Figure 5:
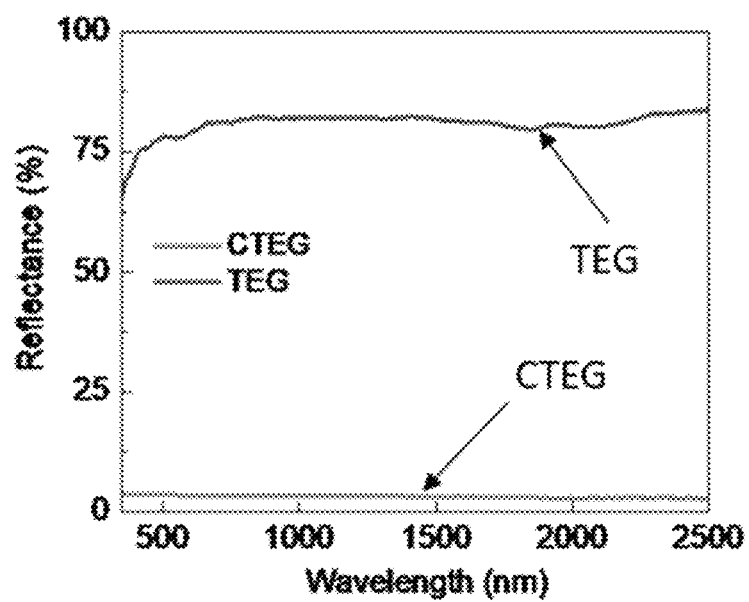
FIG. 5 is a graph showing reflectance spectra of a TEG layer before and after coating of an absorber layer in the wavelength range of 300-2500 nm.

FIG. 5 is a graph showing reflectance spectra of the TEG layer 10 before and after coating of the absorber layer 20 in the wavelength range of 300-2500 nm. As shown, the light reflectance and absorbance of the absorber layer 20 was measured at wavelength between 300 to 2500 nm. The pristine TEG shows over 75% reflectance, while the coated TEG (CTEG) exhibits much stronger light absorption over 96% across the entire solar spectrum, demonstrating the prominent light absorptance of the absorber layer 20.

Figure 6:
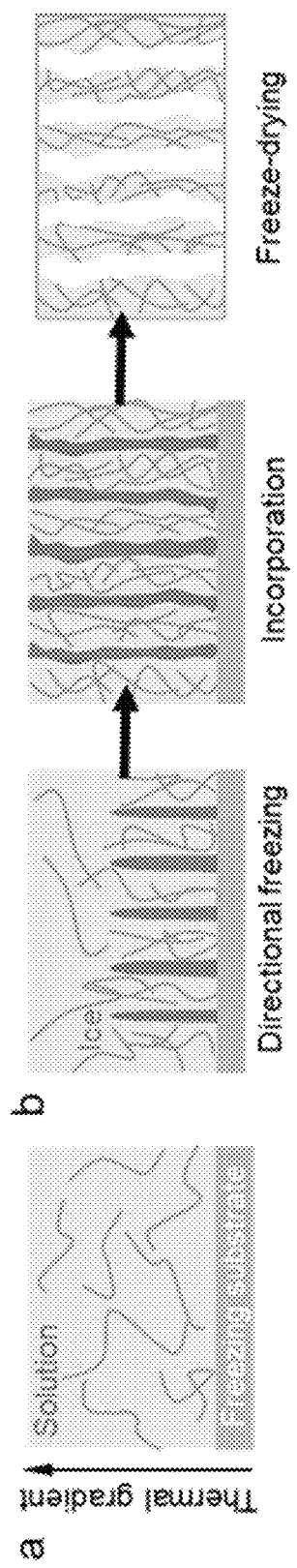
FIG. 6 illustrates a mechanism of directional freezing of an evaporator according to an embodiment of the present invention.

As previously described, the evaporator 40 includes the contact part 40B which is, for example, "trident" shaped part to provide the expanded interfacial cooling region with the cooling structure 30. For this configuration, the evaporator 40 can be prepared by directional freezing. FIG. 6 illustrates a mechanism of directional freezing of the evaporator 40. The water supply ability can be a critical bottleneck for evaporation. To achieve sufficient water replenishment during evaporation, the evaporator 40 can be prepared by directional freezing to have aligned liquid (water) channels. Directional Freezing is a simple method to make crystal clear ice by controlling the direction that water freezes. During directional freezing, the temperature of the freezing substrate will below 0° C., ice then spontaneously is nucleate on the freezing substrate and grown with the thermal gradient. After freeze-drying, the aligned channels are formed in the evaporator.

Figure 7:
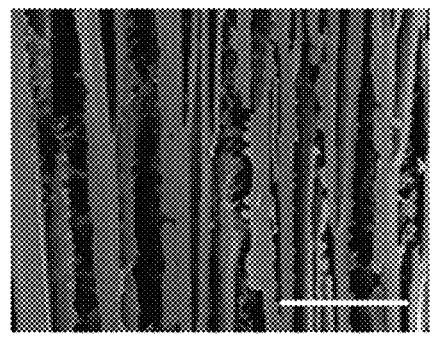
FIG. 7 shows a SEM image of an evaporator according to an embodiment of the present invention.

FIG. 7 shows a SEM image of the evaporator 40 prepared by directional freezing. The aligned channels are successfully prepared.

Figure 8:
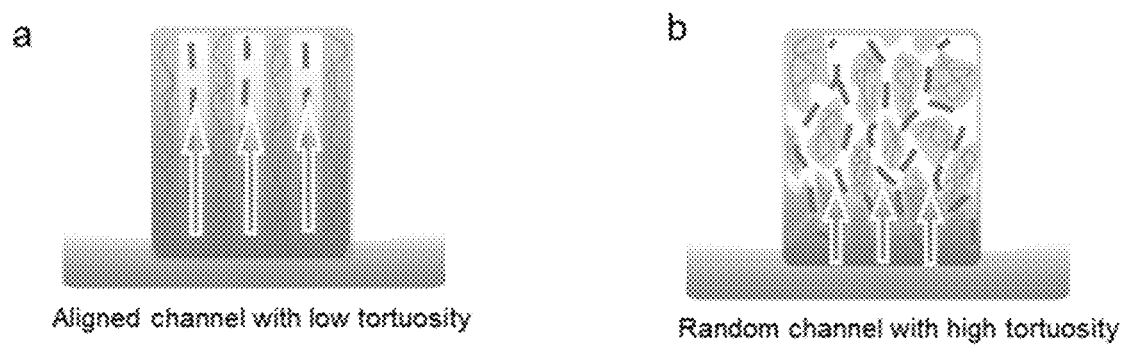
FIG. 8 illustrates fast liquid absorption of aligned channels and random channels according to an embodiment of the present invention.

FIG. 8, in parts (a) and (b), illustrates fast liquid absorption of aligned channels and random channels for comparison. As shown, compared with conventional random porous structure, aligned channels possess lower tortuosity and strong capillary, leading to higher water absorption speed and capacity.

Figure 9:
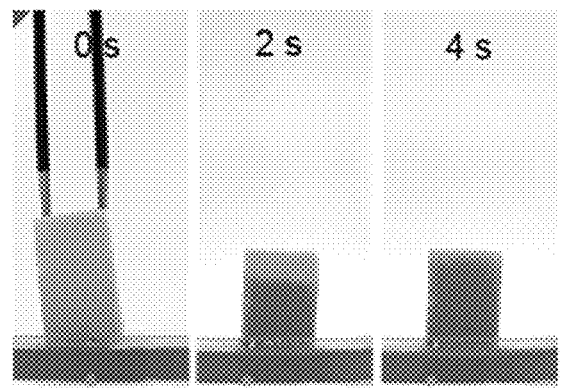
FIG. 9 shows water absorption performance of an evaporator according to time.

FIG. 9 shows water absorption performance of the evaporator 40 according to time. Water is died red for visibility. With reference to FIG. 9, the water absorbing behavior of the evaporator 40 was recorded according to time. It takes only 4 s for being fully hydrated, which guarantees the water supply for evaporation.

Figure 10:
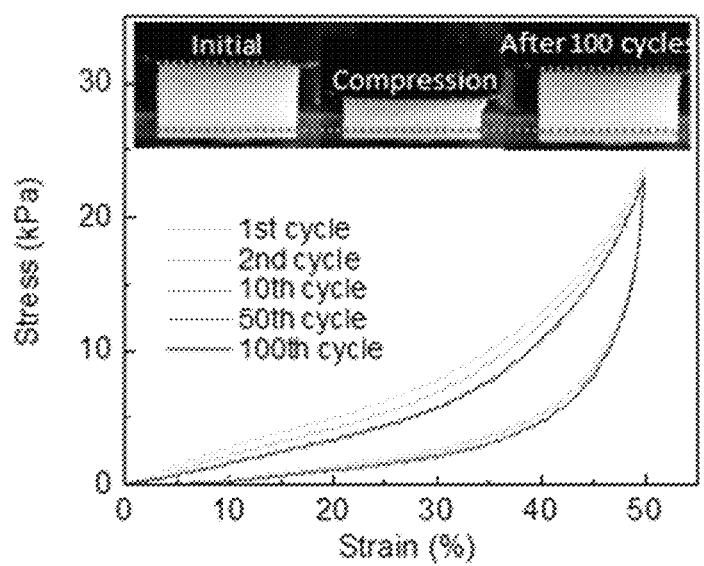
FIG. 10 is a graph describing cyclic compression tests of an evaporator according to an embodiment of the present invention.

FIG. 10 is a graph describing cyclic compression tests of the evaporator 40 according to an embodiment of the present invention. The evaporator 40 exhibits excellent mechanical durability. The material (for example, polyurethane) and the porous structure of the evaporator can contribute to the mechanical performance. After compression over 80% the evaporator 40 can show fast recovery in water. And no obvious damage was observed even after 100 cyclic loading-unloading tests.

Figure 11:
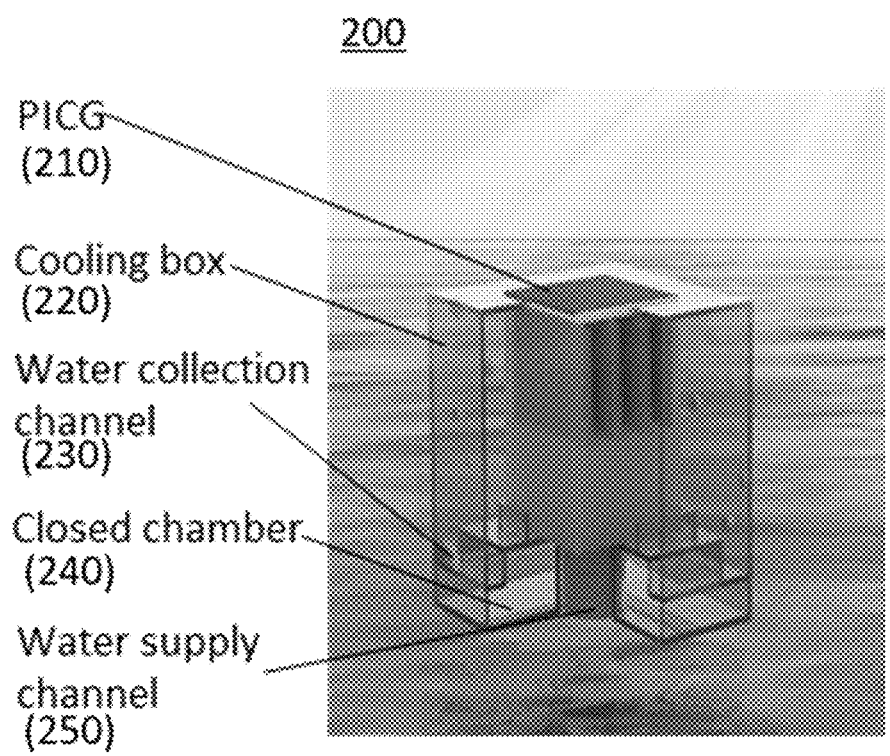
FIG. 11 is a schematic diagram of an invert-structured water and electricity generation apparatus according an embodiment of the invention.

In order to facilitate practical application of the hybrid system as described above, an invert-structured prototype is introduced. For example, FIG. 11 shows a schematic diagram of an invert-structured water and electricity generation apparatus 200 according to an embodiment of the invention. The invert-structured water and electricity generation apparatus 200 can also be called as an invert-structured passive cooling induced co-generator (PICG) apparatus. The invert-structured PICG apparatus 200 includes a PICG module 210 including the hybrid system 100 as described above. The PICG apparatus 200 includes a water supply channel 250 to supply non-purified water (or non-portable water) to the hybrid system of the PICG module 210. The non-purified water can be pumped into the evaporator of the hybrid system through the water supply channel 250. The PICG apparatus 200 includes a cooling box 220 arranged to surround the PICG module 210 and to condense vapor generated from the hybrid system of the PICG module 210. A water collection part 230 is provided to collect the condensed vapor from the cooling box 220. The generated vapor is condensed on the sidewall of the cooling box 220 and flows to the water collection part 230. The collected water in the water collection part 230 is purified water. The PICG apparatus 200 includes a closed chamber 240 to provide buoyancy to keep the apparatus 200 afloat. For example, the PICG apparatus 200 is arranged and floated on a surface of the non-purified water (for example, a sea). The PICG module 210 is placed inside of the invert-structured PICG apparatus 200. For example, the cooling box 220 is arranged to surround the PICG module 210. Moreover, the absorber layer of the hybrid system (of the PICG module 210) is exposed above a top surface of the cooling box 220, as shown in FIG. 11. Unlike conventional solar purifiers that usually place a transparent cover above the evaporator for vapor condensation, the invert-structured prototype condenses vapor on the sidewall of the cooling box 220, which prevents compromised light absorption and ineffective heat transfer during condensation.

Figure 12:
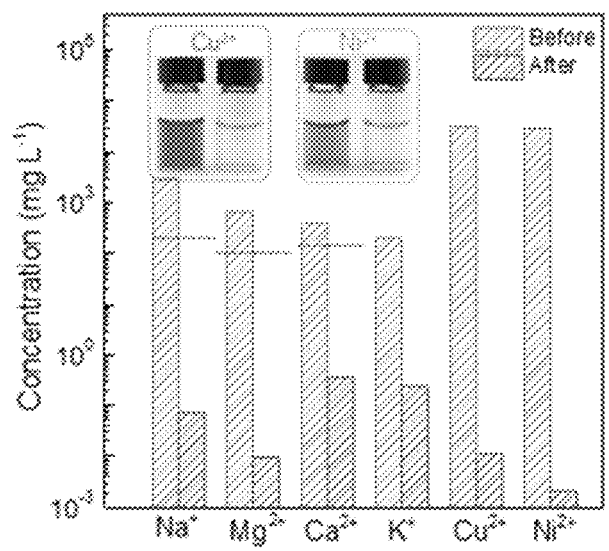
FIG. 12 illustrates removal of heavy metal ions in non-portable water.

FIG. 12 illustrates removal of heavy metal ions in non-portable water after using the invert-structured water and electricity generation apparatus according to the present invention. As shown in FIG. 12, the PICG module shows over 99.9% removal of metal ions (for example, $Na^+$, $Mg^{2+}$, $Ca^{2+}$, $K^+$, $Cu^{2+}$, $Ni^{2+}$) in natural seawater and sewage, and the purified water well meet the drinking water standards of the World Health Organization (WHO).

Figure 13:
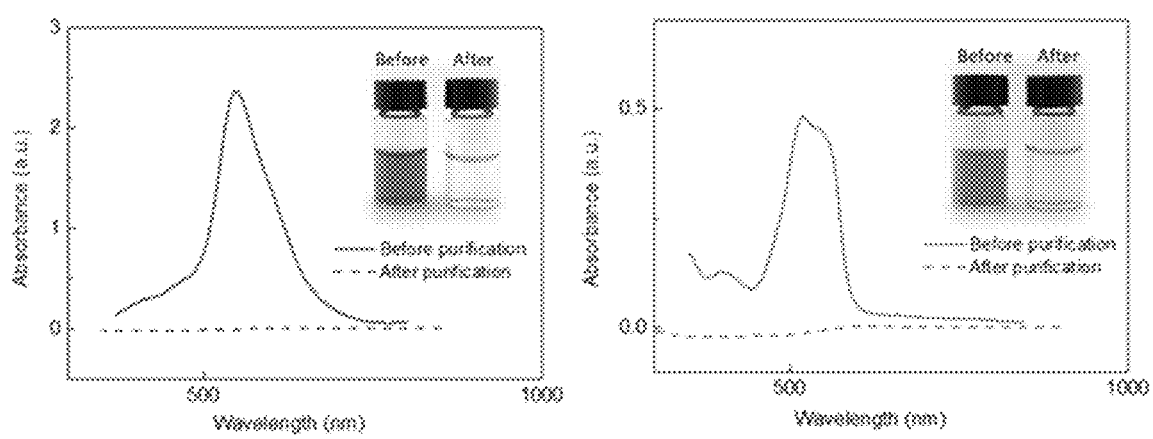
FIG. 13 illustrates removal of organic dyes by PICG module according to an embodiment of the present invention. Absorption spectra of Brilliant Blue R and Rhodamine B before and after purification.

FIG. 13 illustrates removal of organic dyes by the PICG module according to an embodiment of the present invention. Absorption spectra of Brilliant Blue R and Rhodamine B before and after purification. As shown in FIG. 13, organic dyes were fully removed by the PICG module, demonstrating the excellent purification ability of this present invention.

Figure 14:
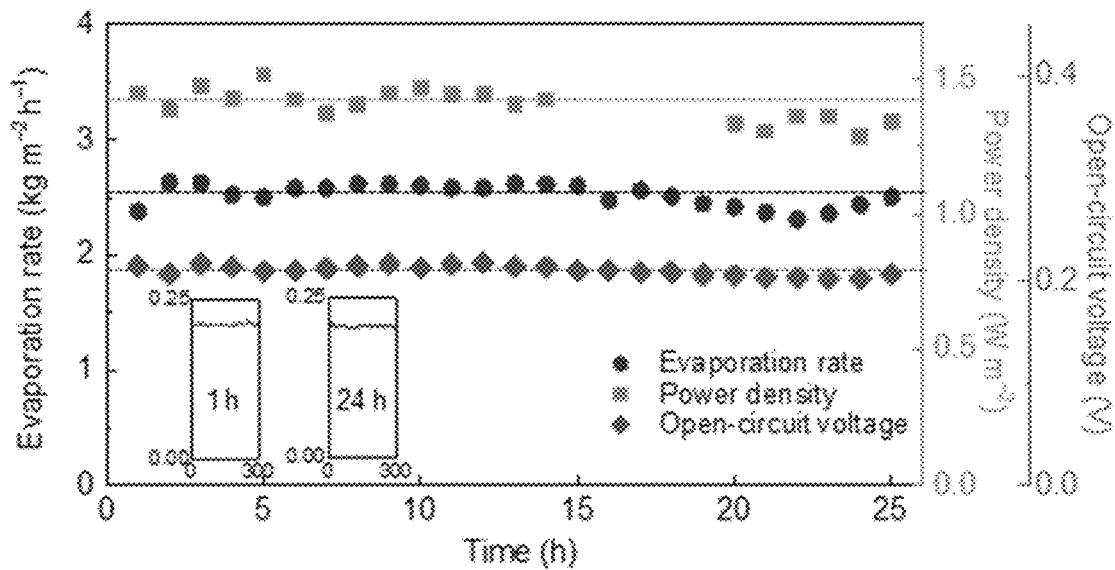
FIG. 14 shows long-term stability of PICG module according to an embodiment of the present invention in high concentrated brine solution (20 wt %)

FIG. 14 shows long-term stability of the PICG module according to an embodiment of the present invention in high concentrated brine solution (20 wt %). As shown in FIG. 14, the long-term stability of PICG in high concentration brine solution (20 wt %) is also tested. Remarkably, even after over 24 h continuous desalination, the high evaporation rate, open-circuit voltage and power density retained. According to the embodiment of the present invention, because of the contactless design of the absorber layer 20 and the evaporator 40, the precipitated salt cannot reach the absorber layer 20, which can avoid affecting the light absorption.

Figure 15:
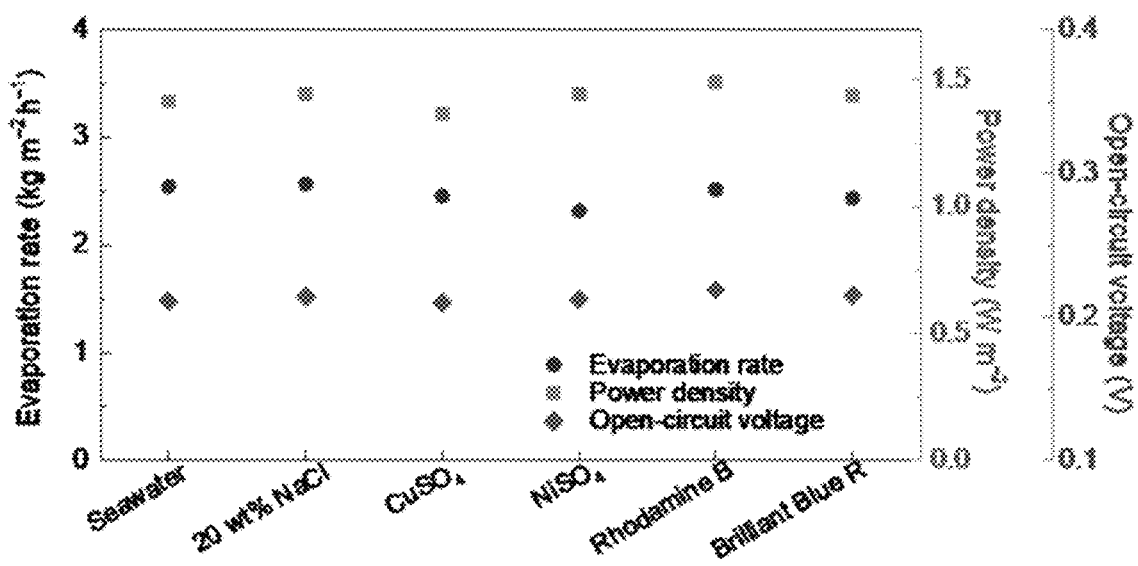
FIG. 15 shows power-water generation performance of PICG apparatus according to an embodiment of the present invention in different solutions.

FIG. 15 shows power-water generation performance of the PICG apparatus according to an embodiment of the present invention in different solutions. As shown in FIG. 15, the PICG apparatus exhibits wide applicability for various liquids. Both evaporation rate and power density remain stable in all tested liquids, including brine solution, organic sewage, heavy metal solution, demonstrating its excellent stability than conventional ion flow induced power-water generators.

Figure 16:
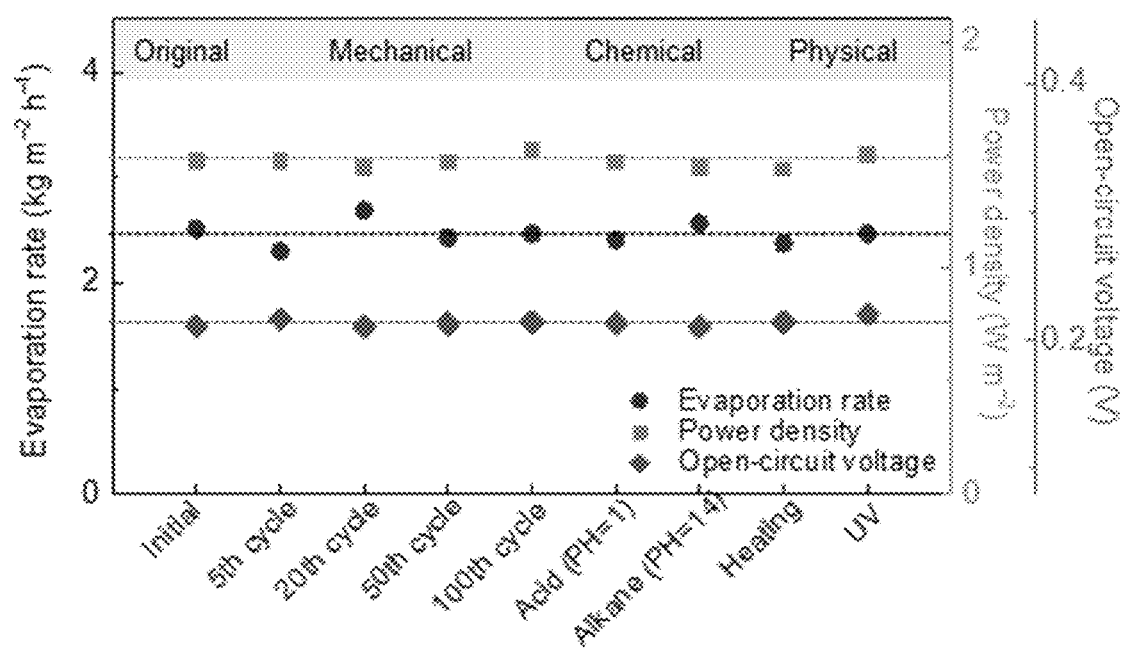
FIG. 16 shows durability of PICG module according to an embodiment of the invention under different surrounding conditions.

FIG. 16 shows durability of the PICG module according to an embodiment of the invention under different surrounding conditions. As shown in FIG. 16, the environmental durability of the PICG module is systematically studied. Results reveal that the power-water generation performance of PICG module is almost unchanged even after various harsh chemical and physical treatments, highlighting its grand potential for practical applications.

In summary, the present invention presents a passive interfacial cooling (PIC) strategy for efficient, durable and applicable electricity-fresh water generation. The cooling structure and its engineering design with the evaporator enhance energy exchange between the power generation and water generation modules. Specifically, the expanded cooling structure-evaporator interface in the design facilitates waste heat conduction from the TEG, causing a hot interface area (called PIC region). The high temperature and large evaporator-air interface at the PIC region promote water evaporation, resulting in a high evaporation rate. Consequently, the fast evaporation induced extensive evaporative latent heat, which cools down the TEG's cold side and leads to improved power generation performance and reduced convection and radiation loss. Besides, the evaporative latent heat contributes to the absorption of energy from the environment, which further supports water production.

According to another aspect of the present invention, it is provided a method for manufacturing the hybrid system for electricity and water generation. The method includes preparing an evaporator, preparing a thermoelectric generator (TEG) layer, coating an absorber layer on one side of the TEG layer, attaching a cooling structure on the other side of the TEG layer, and assembling the TEG layer with the absorber layer and the cooling structure, with the evaporator, such that the cooling structure contacts the evaporator to form an interfacial cooling region.

In an embodiment, preparing the evaporator may include a directional freezing process and a freeze-drying process.

In an embodiment, the directional freezing process is performed in a directional freezing speed of 0.5° C./min, 1° C./min, 2° C./min, 3° C./min, 4° C./min, 5° C./min, 6° C./min, 7° C./min, 8° C./min, 9° C./min, 10° C./min, or any point value within a range consisting of a pairwise combination of those point values.

In an embodiment, the absorber layer may include a photo-thermal material and a polymer matrix, and coating the absorber layer on one side of the TEG layer may include using the polymeric matrix for adhesion of the absorber layer on the TEG layer.

In an embodiment, coating the absorber layer on one side of the TEG layer may further include curing the polymer matrix under 50° C., 60° C., 70° C., 80° C., 90° C., 100° C., 110° C., 120° C., 130° C., 140° C., 150° C., or any point value within a range consisting of a pairwise combination of those point values.

In an embodiment, the cooling structure may include two or more plates and the evaporator may include a contact part having two or more columns that correspond to the two or more metal plates respectively, and assembling the TEG layer with the absorber layer and the cooling structure with the evaporator may include inserting the two or more metal plates into the two or more columns respectively to provide the interfacial cooling region.

According to yet another aspect of the present invention, there is provided a method for manufacturing the invert-structured PICG apparatus. The method includes the steps for the manufacturing method for the hybrid system as described above, and further includes providing a PICG module including the hybrid system, and assembling the PICG module with the water supply channel, the cooling box, the water collection part, and the closed chamber. The cooling box, the water collection part and the closed chamber are used for water condensation, water collection and floating, respectively.

The embodiments and aspects of the present invention provide a passive interfacial cooling (PIC) strategy for high efficiency power generation and water evaporation. This PIC strategy exhibits integrative utilization of multistage energy, including the waste heat from the cold side of the TEG layer, latent heat with phase change, and energy from environment. By 1 intensity of sunlight exposure, it is possible to achieve a high evaporation rate >2 kg m$^{-2}$ h$^{-1}$ and a high power density >1.5 W m$^{-2}$.

The cogenerator exhibits an excellent applicability, long-term stability and durability for treating various no-portable water and under different harsh surrounding conditions. The invert-structured prototype condenses vapor on the sidewall, which prevents compromised light absorption and ineffective heat transfer during condensation. The advantages of this congenerator include excellent solar-heat-conversion property, outstanding water supply property, and remarkable heat management ability (waste heat from the cold side of TEG, latent heat with phase change, and energy from environment), which allows simultaneous enhanced power generation and freshwater production. Besides, in view of the practical application, the applicability, long-term stability and durability of the PICG are also demonstrated. This strategy holds great promise for sustainable electricity and clean water production for remote rural areas.

It should be understood that the above only illustrates and describes examples whereby the present invention may be carried out, and that modifications and/or alterations may be made thereto without departing from the spirit and scope of the invention.

It should also be understood that certain features of the invention, which are, for clarity, described in the context of separate embodiments, may also be provided in combination in a single embodiment. Conversely, various features of the invention which are, for brevity, described in the context of a single embodiment, may also be provided or separately or in any suitable sub-combination.

The invention claimed is:

1. A hybrid system for electricity and water generation, comprising:
   a thermoelectric generator (TEG) layer for converting heat to electricity;
   an absorber layer arranged on one side of the TEG layer for converting solar energy to heat;
   a cooling structure arranged on the other side of the TEG layer for dissipating a waste heat from the TEG layer; and
   an evaporator configured to form an interfacial cooling region with the cooling structure for water generation, wherein the evaporator comprises a porous polymer, wherein the cooling structure comprises a base plate which is attached to the TEG layer, and two or more plates extending from the base plate toward the evaporator to provide an expanded interfacial cooling region.

2. The hybrid system of claim 1, wherein the cooling structure is arranged on a lower surface of the TEG layer.

3. The hybrid system of claim 1, wherein the two or more plates comprise metal plates.

4. The hybrid system of claim 1, wherein the cooling structure comprises Cu, Al, Ag, Ni, stainless steel or a mixture thereof.

5. The hybrid system of claim 1, wherein each of the two or more metal plates has a thickness of about 50 μm-1500 μm.

6. The hybrid system of claim 1, wherein the evaporator comprises a base part, and a contact part on the base part, configured to receive the two or more plates.

7. The hybrid system of claim 6, wherein the contact part comprises two or more columns that correspond to the two or more metal plates, and the two or more metal plates are configured to be inserted into the two or more columns respectively.

8. The hybrid system of claim 1, wherein the porous polymer has a porosity of about 50%-90%.

9. The hybrid system of claim 1, wherein the absorber layer comprises:
- a photo-thermal material to convert the solar energy to heat; and
- a polymer matrix to attach the photo-thermal material on the TEG layer.

10. The hybrid system of claim 9, wherein the photo-thermal material comprises a carbon nanotube, carbon black, carbon nanodots, graphene, MXenes, PPy or a mixture thereof.

11. The hybrid system of claim 9, wherein the polymer matrix comprises polyurethane, cellulose, alginate, polyvinyl alcohol, polyacrylamide, PDMS or a mixture thereof.

12. The hybrid system of claim 1, wherein the absorber layer is arranged on an upper surface of the TEG layer.

13. An invert-structured passive cooling induced cogenerator (PICG) apparatus, comprising,
- a PICG module including the hybrid system of claim 1;
- a water supply channel to supply non-purified water to the hybrid system;
- a cooling box configured to surround the PICG module and to condense vapor generated from the hybrid system of the PICG module;
- a water collection part to collect the condensed vapor from the cooling box; and
- a closed chamber to float the apparatus on a surface of the non-purified water.

14. The invert-structured PICG apparatus of claim 13, wherein the generated vapor is condensed on the sidewall of the cooling box.

15. The invert-structured PICG apparatus of claim 13, wherein the absorber layer of the hybrid system is exposed above a top surface of the cooling box.

16. A method for manufacturing a hybrid system for electricity and water generation, comprising:

preparing a porous polymer evaporator;
preparing a thermoelectric generator (TEG) layer;
coating an absorber layer on one side of the TEG layer;
attaching a cooling structure on the other side of the TEG layer; and
assembling the TEG layer with the absorber layer and the cooling structure, with the evaporator, such that the cooling structure contacts the evaporator to form an interfacial cooling region,
wherein the cooling structure comprises a base plate which is attached to the TEG layer, and two or more plates extending from the base plate toward the evaporator to provide an expanded interfacial cooling region.

17. The method of claim 16, wherein preparing the evaporator comprises a directional freezing process and a freeze-drying process.

18. The method of claim 17, wherein the directional freezing process is performed in a directional freezing speed of 0.5° C./min, 1° C./min, 2° C./min, 3° C./min, 4° C./min, 5° C./min, 6° C./min, 7° C./min, 8° C./min, 9° C./min, 10° C./min, or any point value within a range consisting of a pairwise combination of 5° C./min, 1° C./min, 2° C./min, 3° C./min, 4° C./min, 5° C./min, 6° C./min, 7° C./min, 8° C./min, 9° C./min.

19. The method of claim 16, wherein the absorber layer comprises a photo-thermal material and a polymer matrix, and the coating the absorber layer on the one side of the TEG layer comprises using the polymeric matrix for adhesion of the absorber layer on the TEG layer.

20. The method of claim 19, wherein the coating the absorber layer on the one side of the TEG layer further comprises curing the polymer matrix under 50° C., 60° C., 70° C., 80° C., 90° C., 100° C., 110° C., 120° C., 130° C., 140° C., 150° C., or any point value within a range consisting of a pairwise combination of 50° C., 60° C., 70° C., 80° C., 90° C., 100° C., 110° C., 120° C., 130° C., 140° C., and 150° C.

21. The method of claim 16, wherein the evaporator comprises a contact part having two or more columns that correspond to the two or more metal plates respectively, and assembling the TEG layer with the absorber layer and the cooling structure with the evaporator comprises inserting the two or more metal plates into the two or more columns respectively to provide the expanded interfacial cooling region.

* * * * *